(12) United States Patent
Hareyama

(10) Patent No.: US 6,700,440 B2
(45) Date of Patent: Mar. 2, 2004

(54) HIGH FREQUENCY POWER AMPLIFIER

(75) Inventor: Nobuo Hareyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 41 days.

(21) Appl. No.: 10/155,634

(22) Filed: May 23, 2002

(65) Prior Publication Data

US 2002/0186076 A1 Dec. 12, 2002

(30) Foreign Application Priority Data

May 30, 2001 (JP) ..................................... P2001-161918

(51) Int. Cl.[7] .............................. H03F 1/14; H03F 3/04
(52) U.S. Cl. .......................... 330/51; 330/127; 330/297
(58) Field of Search .......................... 330/51, 127, 296, 330/297, 302

(56) References Cited

U.S. PATENT DOCUMENTS 4,910,478 A * 3/1990 Koyama ....................... 330/51
5,973,557 A * 10/1999 Miyaji et al. .................. 330/51
6,369,651 B1 * 4/2002 Dent ........................... 330/127

* cited by examiner

Primary Examiner—Khanh Van Nguyen
(74) Attorney, Agent, or Firm—Jay H. Maioli

(57) ABSTRACT

A high-frequency power amplifier system including a plurality of individual amplifiers connected in parallel, the amplifiers including switching-driven FET's. A fixed drain voltage is applied to one amplifier and a variable drain voltage is applied to another amplifier through a section including a DC-DC converter that converts the voltage according to a control value of a control signal. The turning on and off of the operation of the power amplifier is controlled by a control signal. Also, the circuit constants of a matching circuit are variable. In a high output power region, the power amplifier is turned on and, in a low output power region, turned off. Thereby, the decrease of efficiency of the power amplifier, owing to the DC-DC converter, may be suppressed to a minimum. The matching of the amplifier is adjusted when the power amplifier is switched on or off so as to improve efficiency. Consequently, it becomes possible to continuously control the output of the amplifier.

6 Claims, 4 Drawing Sheets

HIGH FREQUENCY POWER AMPLIFIER

CROSS REFERENCE TO RELATED APPLICATIONS

This application claims priority to Japanese Patent Application No. JP 2001-161918, filed on May 30, 2001, the disclosure of such application being herein incorporated by reference to the extent permitted by law.

BACKGROUND OF THE INVENTION

1. Field of the Invention

The present invention relates to a high frequency power amplifier using switching-driven transistors, and more particularly, to a high frequency power amplifier permitting continuously controlled power output and attaining improved amplification efficiency.

2. Description of the Related Art

High frequency power amplifiers are conventionally used as amplifiers for antenna output stages of communication devices, or the like. There are amplifiers having various characteristics and, among them, amplifiers having high efficiency as amplifiers are especially suitable for use in the transmitting sections of communication device terminals for digital mobile communication utilizing digital cellular phones or the like. Merits on low electric power consumption, namely extension of the utilization time for batteries of such portable devices, reduction of size of the battery, reduction of heat generation, or the like, are meaningful features for the portable devices.

As a high frequency power amplifier having the high efficiency thereof, a saturated type amplifier such as a field effect transistor (FET) operated in a saturated mode is well known. The saturated type amplifiers are separated in classes, in which a class B amplifier has efficiency higher than a class A amplifier, and a class C amplifier, having a theoretical efficiency of nearly 100%, has an efficiency even higher than the class B amplifier.

However, because the saturated type amplifier operates FET's in their saturated states, it is impossible to control the outputs of the amplifier by changing the inputs thereof like a linear amplifier.

Accordingly, a method for changing output of the saturated type amplifier through a drain voltage of the FET is adopted. In such drain voltage control method, the output of the amplifier is controlled by a drain application voltage obtained by converting voltage according to an amount of control by a DC-DC converter. As a result, when adopting the drain voltage control method, the efficiency of the amplifier as a whole is directly affected by the efficiency of the DC-DC converter. In other words, the FET's of the amplifier are operated in their saturated states or modes. That is, because the efficiency of the DC-DC converter is around 80% at the most, the efficiency of the whole of the amplifier is reduced to 80% owing to the efficiency of the DC-DC converter even if the FET's are operated under the efficiency of nearly 100% on their saturated states.

SUMMARY OF THE INVENTION

The present invention has been conceived in consideration of the aforesaid problems in the prior art. It is preferable according to the invention to provide a high frequency power amplifier having further improved efficiency thereof in comparison with a conventional amplifier and having a structure such that its output can be controlled continuously by changes in the drain voltages of switching-driven transistors.

A first preferred embodiment of the present invention presents a high frequency power amplifier using a plurality of switching-driven transistors, the amplifier including a plurality of switching-driven transistors, the transistors being connected in parallel with each other; means or unit for applying a fixed drain voltage to part of the plurality of transistors; means or unit for applying a variable drain voltage to another part of the plurality of transistors according to a control value; means or unit for turning on or off an operation of the part of the plurality of transistors having fixed drain voltage applied thereon; and means or unit for controlling an output of the amplifier by turning variable an output of the amplifier through controlling a drain voltage of the other part of the plurality of transistors, as well as turning on the operation of the part of the plurality of transistors in a high output power region and, in a low output power region, turning off the operation of the part of the plurality of transistors that have been turned on.

According to the first preferred embodiment of the invention, the high frequency power amplifier is provided with the means or unit for controlling the output of the amplifier. The means controls the means for turning on or off the operation of the portion of the plurality of transistors, which are connected in parallel and are switch-driven, turning on the operation of the portion of the plurality of transistors in the high output power region and turning off the operation of the portion of the plurality of transistors in the low output power region. Consequently, the reduction of efficiency on the side of the other portion of the plurality of transistors, having variable drain voltage according to the control value, can be suppressed to a minimum. Thus, it becomes possible to control the output power of the amplifier while keeping relatively high efficiency.

A second preferred embodiment of the present invention further includes a matching circuit having a variable circuit constant, disposed on an output side of the plurality of transistors; and means or unit for optimizing the circuit constant of the matching circuit according to the output of the amplifier.

A third preferred embodiment of the present invention further has the means for optimizing the circuit constant including a means or unit for switching the circuit constant in accordance with the turning on or off of the operation of such portion of said plurality of transistors.

According to the second and the third preferred embodiments of the invention, as the amplifier being provided with the means for optimizing setting of the circuit constant of the matching circuit according to the output of the amplifier, it becomes possible to achieve the improvement of the stability thereof as well as the improvement of the efficiency thereof, in addition to the advantages of the first embodiment. Furthermore, the amplifier according to the third preferred embodiment switches the circuit constant in accordance with the turning on or off of the operation of the portion of the plurality of transistors, and thereby the operation of the amplifier can easily be implemented by means of a common controller.

A fourth preferred embodiment of the present invention presents the high frequency power amplifier according to the first preferred embodiment with the means for applying the variable drain voltage to the other part of said plurality of transistors including a means for enabling continuous control of the applied drain voltage.

A fifth preferred embodiment of the present invention has the high frequency power amplifier according to the fourth preferred embodiment including the means for enabling the continuous control of the drain voltage including a DC-DC converter.

According to the fourth and the fifth preferred embodiments of the invention, as the amplifier is provided with the means or unit (such as the DC-DC converter) for enabling the continuous control of the drain voltage to be applied to the transistors, it becomes possible to adjust the output power of the amplifier most suitably for preventing waste of electric power and for performing a more suitable operation thereof in addition to the advantages of the aforesaid first to the third preferred embodiments.

BRIEF DESCRIPTION OF THE DRAWINGS

The above and other objects, features and advantages of the present invention will become more apparent to those skilled in the art from the following description of the presently preferred exemplary embodiments of the invention taken in conjunction with the accompanying drawings, in which.

DESCRIPTION OF THE PREFERRED EMBODIMENTS OF THE INVENTION

A high frequency power amplifier according to a preferred embodiment of the present invention is described in the following in association with the attached drawings.

The present invention concerns the high frequency power amplifier the output power of which can continuously be controlled by the changes of the drain voltages of switching-driven transistors. The present invention has been conceived taken in account improving efficiency of the amplifier more than a conventional amplifier employing a similar system.

Various cases can be considered in which continuous control of the output of a high frequency power amplifier is needed. In the following, the case where the continuous control is applied to a high frequency power amplifier in an antenna output stage of a communication device for digital mobile communication (such as a cellular phone or the like) is shown as a suitable example. Here, a case is exemplified and the detail thereof is described in the following. In the case, the output power of a high frequency power amplifier in an antenna output stage is continuously controlled for performing outputting to a transmission destination such as a base station or the like at suitable power without using surplus power.

Figure 1:
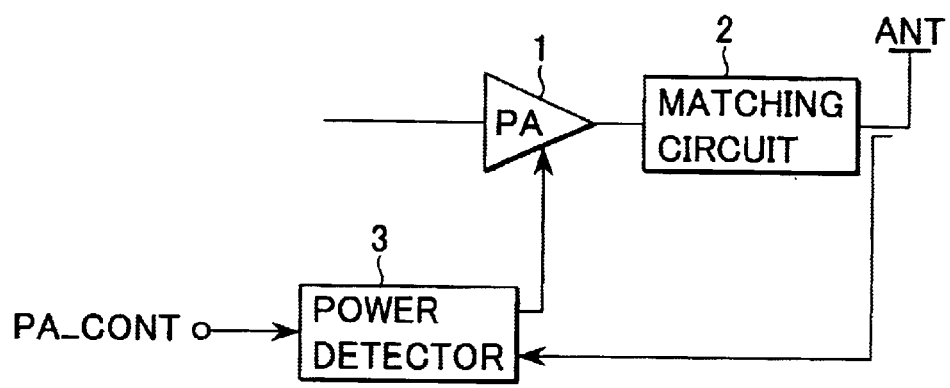
FIG. 1 is a schematic block diagram showing an example of a system for continuously controlling the output power of a high frequency power amplifier in an antenna output stage, according to a preferred embodiment of the present invention.

A continuous control like this is performed by a system exemplified in the block diagram of FIG. 1.

When FIG. 1 is referred, the output power control of a RF power amplifier 1 is performed such that it can be controlled by predetermined steps by a PA_CONT signal (a direct current (DC) signal). The PA_CONT signal is supplied from a controller (not shown) being a microcomputer to the RF power amplifier 1 such that the values detected by an output power detector 3 (the detector 3 detects the power output from the RF power amplifier 1 through a matching circuit 2 in this case) are an instructed value transmitted from a base station (not shown) as a target value. Then the instructed power is output from the matching circuit 2.

In the present preferred embodiment of the present invention, a plurality of switching-driven transistors are used in a configuration such that the transistors are connected in parallel for the improvement of efficiency of the high frequency power amplifier, the output power of which can continuously be controlled as shown in FIG. 1. A fixed drain voltage is applied to portion of the plurality of transistors connected in parallel, and a variable drain voltage is applied to the other portion of the transistors according to a control value. Moreover, the turning on and off of the transistors having fixed drain voltages are made controllable.

Such a configuration enables the execution of the following operations. That is, the operations of the transistors having fixed drain voltages are turned on in a high output power region. And, the operations, which have been turned on in the high output power region, of the transistors having fixed drain voltages are tuned off in a low output power region. Consequently, the efficiency in the high output power region in which the operations of the transistors having fixed drain voltage are turned on can be improved. Furthermore, the continuous control of the output power in the whole region can be enabled.

Figure 2A:
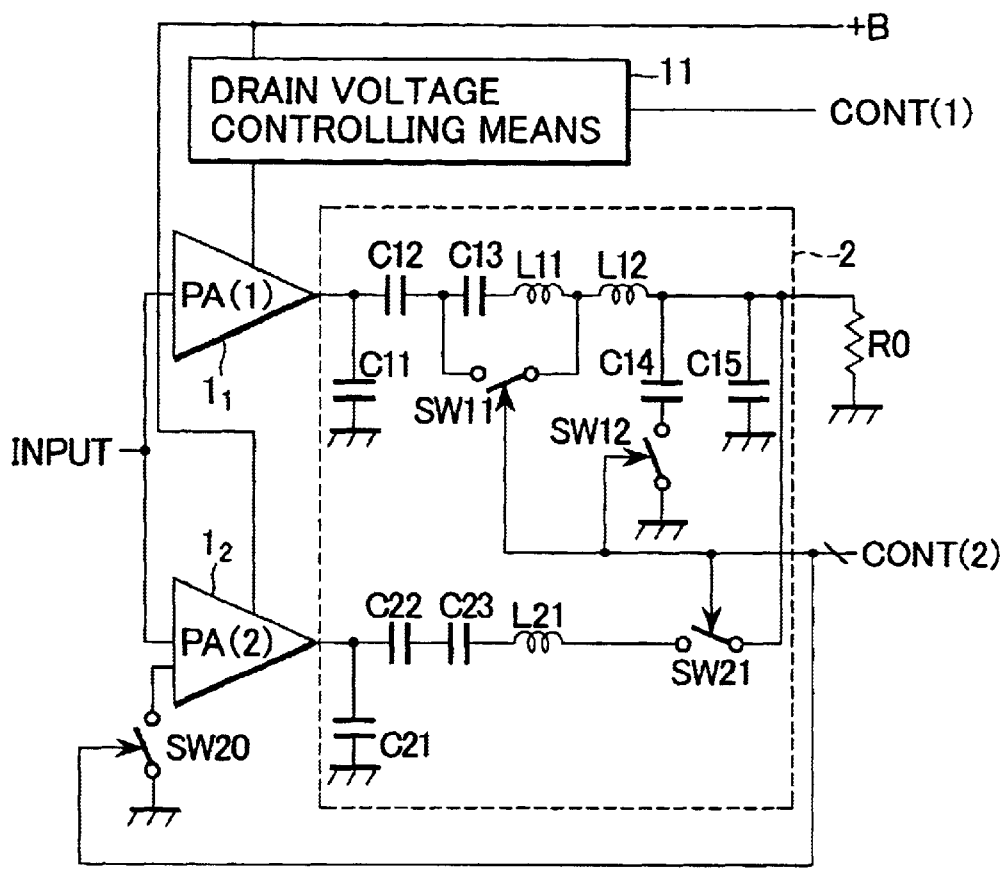
FIGS. 2(A), 2(B) and 2(C) are circuit diagrams showing a high frequency power amplifier, according to a preferred embodiment of the present invention.
Figure 2B:
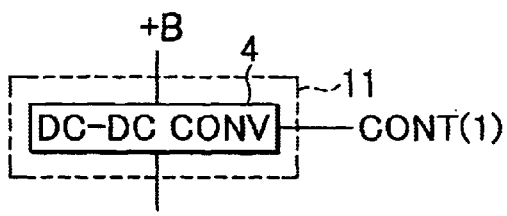
Figure 2C:
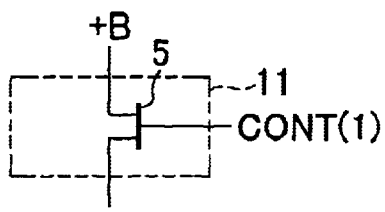

FIGS. 2(A), 2(B) and 2(C) are circuit diagrams showing an embodiment that employs the aforesaid configuration for improving the efficiency of a high frequency power amplifier of the present invention and the drain voltage controlling means thereof. In addition, FIG. 2(A) shows a schematic overview of the circuit, and FIGS. 2(B) and 2(C) respectively show specific examples of a drain voltage controlling means as a circuit element for the amplifier.

As shown in FIGS. 2(A)–2(C), the high frequency power amplifier circuit according to the present embodiment of the invention is provided with power amplifiers comprised of a plurality of switching-driven transistors, which are connected in parallel with each other, (in the present embodiment, as a matter of fact, the power amplifiers are indicated as power amplifiers and PA(1) $1_1$ and PA(2) $1_2$ having field effect transistors as constitutive elements) and a matching circuit 2 for making it possible to obtain the maximum output of the amplifier as fundamental circuit elements. Incidentally, a load is indicated as a load resistance Ro of the output terminal in FIG. 2(A).

Figure 3:
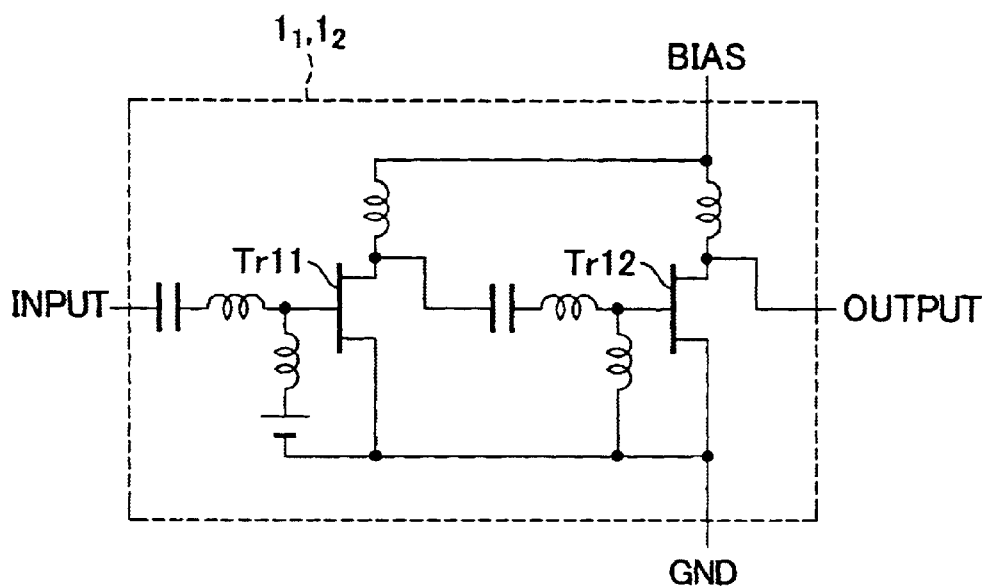
FIG. 3 is a circuit diagram showing an inner configuration of power amplifiers PA(1) and PA(2) used in the high frequency power amplifier shown in FIG. 2, according to a preferred embodiment of the present invention.

The power amplifiers PA(1) $1_1$ and PA(2) $1_2$ shown in FIG. 2(A) are respectively composed of switching-driven transistors (FET) Tr11 and Tr12, which are connected in two steps, as shown in FIG. 3 as the inner configuration of the circuits. The power amplifiers PA(1) $1_1$ and PA(2) $1_2$ have generally been used as a power amplifier using switching-driven FET's. In addition, as shown in FIG. 2(A), drain voltages are applied to each of the FET's of the power amplifier PA(1) $1_1$ and PA(2) $1_2$. The high frequency power amplifier circuit applies a fixed DC voltage +B to the power amplifier PA(2) $1_2$, and is provided with a drain voltage controlling means 11 converting the DC voltage +B according to a control value in order to apply a variable voltage to the other power amplifier PA(1) $1_1$. It is preferable that the drain voltage controlling means 11 includes a circuit that continuously controls the drain voltage according to control values like a DC-DC converter 4 shown in FIG. 2(B).

Moreover, a control circuit using an FET 5 having a similar function may be used as shown in FIG. 2(C).

The matching circuit 2 shown in FIG. 2(A) is configured as follows. That is, capacitors C12 and C13 and inductors L11 and L12 are serially connected between the output terminal of the power amplifier PA(1) $1_1$ and the load resistance Ro. Also, capacitors C22 and C23 and an inductor L21 are serially connected between the output terminal of the power amplifier PA(2) $1_2$ and the load resistance Ro. Furthermore, a capacitor C11 is connected with the output terminal of the power amplifier $1_1$ in parallel with the load resistance Ro. Moreover, a capacitor C21 is connected with the output terminal of the power amplifier $1_2$ in parallel with the load resistance Ro. Besides, capacitors C14 and C15 are connected with the load resistance Ro in parallel with the load resistance Ro. Among the circuit elements in the matching circuit 2, a branch comprising the capacitor C13 and the inductor L11, a branch comprising the capacitor C14, and a branch comprising the capacitors C22 and C23 and the inductor L21 are connected or cut off to change the circuit constants of the matching circuit 2 for matching.

In addition, the specific examples of the circuit constants of the matching circuit 2 shown in FIG. 2 are: C11=7 pF; C12, C13=34 pF; L11=1.7 nH; L12=2.9 nH; C14=5 pF; C15=24 pF; C21=7 pF; C22=17 pF; L21=4.5 nH. The matching circuit 2 can be implemented with these circuit constants.

Moreover, switches SW20 and SW21 shown in FIG. 2(A) are changeover switches for turning on or off the operation of the power amplifier according to output power regions. Similarly, switches SW11 and SW12 are switches for performing the connection and splitting off of the branches composed of the aforesaid circuit components in the matching circuit 2 in accordance with the matching condition changed by the turning on or off of the operation of the power amplifier PA(2) $1_2$ according to the output power regions for changing the circuit constants.

Next, an operation of the high frequency power amplifier shown in FIG. 2(A) is described below.

The amplifier according to a preferred embodiment of the present embodiment uses two power amplifiers PA(1) $1_1$ and PA(2) $1_2$. There is a case where both power amplifiers PA(1) $1_1$ and PA(2) $1_2$ are operated (the operation in a high output power region) and a case where only the power amplifier PA(1) $1_1$ is operated (the operation in a low output power region). In both cases, the continuous control of the output of the high frequency power amplifier is performed by the control of the drain voltage of the power amplifier PA(1) $1_1$.

When there is designation of target value for the high output power region, a control signal CONT(2) for operating both the power amplifiers PA(1) $1_1$ and PA(2) $1_2$ is transmitted from the controller. The switch SW20 is turned off and the switch SW21 is turned on by the control signal CONT(2) to change the power amplifier PA(1) $1_2$ to the operation mode thereof. Then, the control signal CONT(2) turns off the switch SW11 so as to make the branch of the capacitor C13 and the inductor L11 turn to connected mode. Also, the control signal CONT(2) turns off the switch SW12 to cut off the branch of the capacitor C14. Thereby, the circuit constants of the matching circuit 2 are set to meet the matching condition in the case where both the power amplifiers PA(1) $1_1$ and PA(2) $1_2$ are operated. The operation condition of the high frequency power amplifier is thus set and the voltage +B in the figure is changed by the drain voltage controlling means (unit) 11 according to a control signal CONT(1) for controlling the output of the amplifier to the target value. Then the changed voltage is applied to the power amplifier PA(1) $1_1$ as its drain voltage. If the DC-DC converter 4 (shown in FIG. 2(B) as DC-DC CONV) is used as the drain voltage controlling means 11, the application voltage to the drain of the power amplifier PA(1) $1_1$ is controlled by changing a conversion coefficient of the DC-DC converter 4 to the voltage +B according to the control signal CONT(1). Moreover, if the control circuit using the FET 5 (shown in FIG. 2(C)) is used, the voltage +B is changed by the gate control of the FET 5 by means of the control signal CONT(1) so as to control the application voltage to the drain of the power amplifier PA(1) $1_1$.

Figure 4:
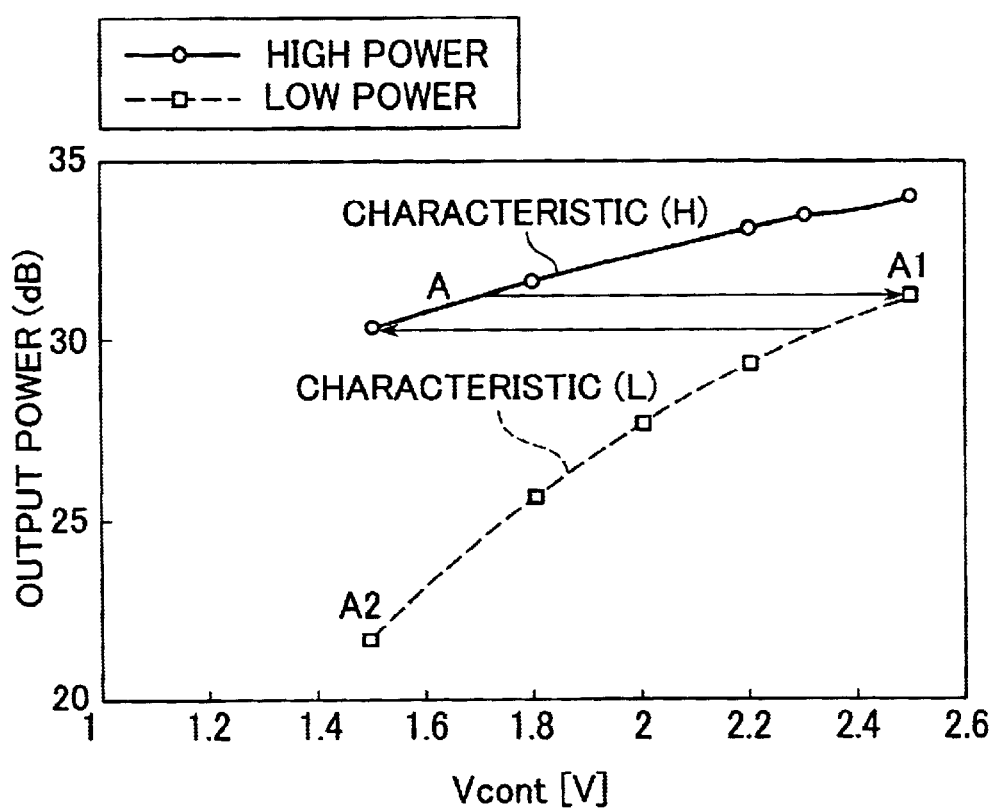
FIG. 4 is a graph showing a relation of output power against drain bias controlling voltage, as a characteristic of the high frequency power amplifier shown in FIG. 2, according to a preferred embodiment of the present invention.

FIG. 4 shows the characteristics of the amplifier of the present embodiment. The abscissa axis of the graph shown in FIG. 4 indicates the drain voltages Vcont applied to the FET's of the power amplifier PA(1) $1_1$. The ordinate axis of the graph indicates the output power (dBm) of the amplifier. A characteristic of the amplifier when the drain voltage controlling means 11 is controlled by the control signal CONT(1) in the operation mode in the high output power region is shown in FIG. 4 as a graph designated by a reference mark of "characteristic (H)". As it is clear from the graph, the output power of the amplifier can continuously be changed within a range from the maximum power satisfying the value required by a standard (e.g. 33 dBm: 2 W) to an A point (e.g. 31 dBm) when the drain voltage Vcont is changed within a range of 2.5 V to 1.5 V.

When there is indication of a target value in the low output power region, in order to decrease the output power to less than the A point, the operation of the power amplifier PA(2) $1_2$ is turned off, though the operation mode of the power amplifier PA(1) $1_1$ is kept as it is. For this purpose, the control signal CONT(2) is transmitted from the controller, the switch SW20 is turned on and the switch SW21 is turned off. Then, the operation of the power amplifier PA(2) $1_2$ is turned off. Consequently, the power amplifier $1_2$ is cut off from the main power amplifier PA(1) $1_1$. The control signal CONT(2) further turns on the switch SW11 to cut off the branch of the capacitor C13 and the inductor L11. The control signal CONT(2) turns on the switch SW12 to connect the branch composed of the capacitor C14. Thereby, the circuit constants of the matching circuit 2 are set to meet the matching condition in the low power operation, i.e. the operation mode of only the power amplifier PA(1) $1_1$ in the present embodiment. After the setting of the operation condition in such a way, the control signal CONT(1) for controlling the output of the amplifier to the target value is set again. Then, the voltage +B is converted by the drain voltage controlling means 11 according to the newly set control signal CONT(1). Thus, the converted voltage is applied to the power amplifier PA(1) $1_1$ as its drain voltage.

In other words, as the characteristic of the amplifier in the case where the drain voltage controlling means 11 is controlled by the control signal CONT(1) in the operation mode in the low output power region, the output power of the amplifier can continuously be changed according to set values as shown as a graph designated by a reference mark "characteristic(L)" in FIG. 4. The set values are newly set within a range from an A1 point on the graph characteristic (L) corresponding to the A point on the graph characteristics (H) when the output power is changed from the high power to the low power to an A2 point at which the amplifier outputs the minimum power (e.g. 22.5 dBm) in the range of the drain voltage Vcont from 2.5 V to 1.5V.

As described above, according to the amplifier of the present embodiment, by the turning off (on) the operation of the power amplifier PA(2) $1_2$ having the drain voltage fixed, at the A (A1) point, the amplifier can continuously be controlled to output the whole range of output power from the maximum power satisfying the value required by a standard (e.g. 33 dBm: 2W) to the minimum power (e.g. 22.5 dBm) at the A2 point. Moreover, the amplifier of the present embodiment can have an improved efficiency in the high output power region where the operation of the power amplifier PA(2) $1_2$ having the drain voltage fixed, is turned on (by the degree of not using the drain voltage controlling means 11) in comparison with the case where the whole region of the output power is continuously controlled by means of only the power amplifier $1_1$ with the drain voltage controlling means 11 without using the power amplifier $1_2$, the drain voltage of which is fixed. Furthermore, when the operation of the power amplifier PA(2) $1_2$ having the drain voltage fixed is tuned on or off, the efficiency can further be improved by the performance of the adjustment of the matching for obtaining maximum output power by changing the circuit constants of the matching circuit 4. In the future, the matching circuit 4 may be made as an integrated circuit including the switch circuits thereof. This trend can be considered to largely contribute to the improvement of efficiency.

Furthermore, although the circuit of the present embodiment shown in FIG. 2(A) uses two kinds of power amplifiers PA(1) $1_1$ and PA(2) $1_2$, one of each kind, the power amplifiers are not limited to the numbers presented is this specific embodiment. Thus, an arbitrary number of the power amplifiers may be provided. In short, the aimed object may be achieved as long as the two kinds of power amplifiers operate in the manner described above.

In addition, although the embodiment described above presupposes a cellular phone as an object in which the high frequency amplifier of the present invention may suitably be implemented and, the invention being implemented as a high frequency power amplifier in the antenna output stage of the cellular phone, it is to be understood that the field and the output power of the present invention are not limited to those of the aforesaid preferred embodiment. The present invention can be implemented as an amplifier in various other fields such as a radio, a television, audio visual (AV) equipment and the like using a high frequency power amplifier using switching-driven transistors.

Although the invention having been described in its preferred form with a certain degree of particularity, obviously many changes, variations, combinations and subcombinations are possible therein. It is therefore to be understood that the present invention may be practiced other than as specifically described herein without departing from scope thereof.

What is claimed is:

1. A high-frequency power amplifier having a plurality of switching-driven transistors, said amplifier comprising:
   a plurality of switching-driven transistors connected in parallel with each other;
   means for applying a fixed drain voltage to a first portion of said plurality of transistors;
   means for applying a variable drain voltage to a second portion of said plurality of transistors according to a control value;
   means for turning on or off an operation of the first portion of said plurality of transistors having a fixed drain voltage; and
   means for controlling an output of said amplifier by varying an output of said high-frequency power amplifier through controlling a drain voltage of said second portion of said plurality of transistors and by turning on the operation of the first portion of said plurality of transistors in a high output power region and, in a low output power region, turning off the operation of said plurality of transistors that have been turned on.

2. The high-frequency power amplifier according to claim 1, further comprising:
   a matching circuit having a variable circuit constant connected to an output side of said plurality of transistors; and
   means for optimizing said variable circuit constant of said matching circuit according to the output of said high-frequency amplifier.

3. The high-frequency power amplifier according to claim 2, wherein said means for optimizing said variable circuit constant includes means for switching said variable circuit constant in accordance with the turning on or off of the operation of said first portion of said plurality of transistors.

4. The high-frequency power amplifier according to claim 1, wherein said means for applying the variable drain voltage to said second portion of said plurality of transistors includes means for enabling continuous control of the applied drain voltage.

5. The high-frequency power amplifier according to claim 4, wherein said means for enabling continuous control of the applied drain voltage includes a DC-DC converter.

6. A high-frequency power amplifier using a plurality of switching-driven transistors, said amplifier comprising:
   a plurality of switching-driven transistors connected in parallel with each other;
   a first unit for applying a fixed drain voltage to a first portion of said plurality of transistors;
   a second unit for applying a variable drain voltage to a second portion of said plurality of transistors according to a control value;
   a switching unit for turning on or off an operation of the first portion of said plurality of transistors having a fixed drain voltage; and
   a controller for controlling an output of said amplifier by varying an output of said amplifier through controlling a drain voltage of said second portion of said plurality of transistors and by turning on the operation of the first portion of said plurality of transistors in a high output power region and, in a low output power region, turning off the operation of said plurality of transistors that have been turned on.

* * * * *